(12) United States Patent
Abe

(10) Patent No.: US 10,879,438 B2
(45) Date of Patent: Dec. 29, 2020

(54) LIGHT EMITTING MODULE AND MANUFACTURING METHOD OF LIGHT EMITTING MODULE

(71) Applicant: TOSHIBA HOKUTO ELECTRONICS CORPORATION, Asahikawa (JP)

(72) Inventor: Tsuyoshi Abe, Hokkaido (JP)

(73) Assignee: Toshiba Hokuto Electronics Corporation, Asahikawa (JP)

( * ) Notice: Subject to any disclaimer, the term of this patent is extended or adjusted under 35 U.S.C. 154(b) by 0 days.

(21) Appl. No.: 16/282,772

(22) Filed: Feb. 22, 2019

(65) Prior Publication Data
US 2019/0386188 A1 Dec. 19, 2019

(30) Foreign Application Priority Data
Jun. 15, 2018 (JP) .................... 2018-114378

(51) Int. Cl.
| | |
|---|---|
| *H01L 33/56* | (2010.01) |
| *H01L 33/54* | (2010.01) |
| *H01L 33/62* | (2010.01) |
| *H01L 25/075* | (2006.01) |

(52) U.S. Cl.
CPC .......... *H01L 33/56* (2013.01); *H01L 25/0753* (2013.01); *H01L 33/54* (2013.01); *H01L 33/62* (2013.01); *H01L 2933/005* (2013.01); *H01L 2933/0016* (2013.01); *H01L 2933/0033* (2013.01)

(58) Field of Classification Search
CPC ......... H01L 33/56; H01L 33/54; H01L 33/62; H01L 25/0753; H01L 2933/0033; H01L 2933/005; H01L 2933/0016
USPC ........................................................... 257/89
See application file for complete search history.

(56) References Cited

U.S. PATENT DOCUMENTS

| | | | |
|---|---|---|---|
| 2016/0276322 A1* | 9/2016 | Maki ...................... | H01L 33/62 |
| 2017/0012027 A1* | 1/2017 | Maki ...................... | H01L 33/52 |

FOREIGN PATENT DOCUMENTS

JP 2012-084855 A 4/2012

\* cited by examiner

*Primary Examiner* — Karen Kusumakar
*Assistant Examiner* — Adam S Bowen
(74) *Attorney, Agent, or Firm* — Burr & Brown, PLLC

(57) ABSTRACT

According to one embodiment, a light emitting module includes a first insulating film having optical transparency, a second insulating film arranged facing the first insulating film and having optical transparency, a conductor layer formed on the first insulating film, and a plurality of light emitting elements arranged between the first insulating film and the second insulating film and connected to the conductor layer in a first surface on one side. Each of the plurality of light emitting elements including a first electrode in which a height from a second surface opposite to the first surface is a first height and a second electrode in which a height from the second surface is a second height. The plurality of light emitting elements are arranged such that a distance between the first electrodes of adjacent light emitting elements is smaller than a distance between the second electrodes.

19 Claims, 23 Drawing Sheets

LIGHT EMITTING MODULE AND MANUFACTURING METHOD OF LIGHT EMITTING MODULE

CROSS REFERENCE TO RELATED APPLICATION

This application is based upon and claims the benefit of priority from the prior Japanese Patent Applications No. 2018-114378, filed on Jun. 15, 2018, the entire contents of which are incorporated herein by reference.

FIELD

Embodiments described herein relate generally to a light emitting module and a manufacturing method of light emitting module.

BACKGROUND

In recent years, light emitting elements such as light emitting diodes (LEDs) with relatively low power consumption have been attracting attention as a next generation light source. The LED is compact, has a small amount of heat generation, and has good responsiveness. Therefore, it is widely being used for various optical devices. For example, in recent years, a light emitting module using an LED arranged on a substrate having flexibility and translucency as a light source has been proposed.

The light emitting module includes a pair of transparent films and a plurality of LEDs arranged between the transparent films, for example. Further, as a pair of transparent films are laminated, the LED is held by the transparent films.

In the light emitting module described above, for example, an LED including a pair of electrodes on one side is used as a light source. In such a type of LED, a cathode electrode and an anode electrode are respectively formed in an N-type semiconductor layer and a P-type semiconductor layer stacked on a top surface of a base substrate. Accordingly, the cathode electrode and the anode electrode are arranged at different heights.

For this reason, when a plurality of LEDs are arranged close to each other, if the cathode electrodes and the anode electrodes having different arrangement heights are brought close to each other between adjacent LEDs, a variation may occur in a connection strength between each electrode and the conductor layer formed on the transparent film.

Further, there is currently no LED that emits light of white or a specific intermediate color. For this reason, in the light emitting module that appears to emit white light or the like, for example, LEDs emitting red light, green light, and blue light are arranged close to each other so that lights from the respective LEDs are mixed. If the red light, the green light, and the blue light are mixed at an appropriate ratio, it appears to human eyes that the light emitting module emits light of white or an intermediate color.

However, there are cases in which LEDs have different structures and sizes depending on a color of light to be emitted. For this reason, if a plurality of types of LEDs are arranged close to each other, LEDs having different thicknesses and different electrode arrangement heights are arranged adjacent to each other. In this case, when the LEDs are laminated by a pair of transparent films, an LED having a thin thickness or an LED having a low electrode arrangement height are unlikely to be held properly by the transparent films. As a result, the connection strength between the electrode of the LED and the conductor layer formed on the transparent film is likely to vary for each LED.

Particularly, when LEDs are densely arranged, a variation in the connection strength caused due to a difference in structure between adjacent LEDs is likely to be significant.

DETAILED DESCRIPTION

According to one embodiment, a light emitting module includes a first insulating film having optical transparency, a second insulating film arranged facing the first insulating film and having optical transparency, a conductor layer formed on the first insulating film, and a plurality of light emitting elements arranged between the first insulating film and the second insulating film and connected to the conductor layer in a first surface on one side. Each of the plurality of light emitting elements including a first electrode in which a height from a second surface opposite to the first surface is a first height and a second electrode in which a height from the second surface is a second height. The plurality of light emitting elements are arranged such that a distance between the first electrodes of adjacent light emitting elements is smaller than a distance between the second electrodes.

First Embodiment

Hereinafter, a first embodiment of the invention will be described with reference to the drawings. For the description, an XYZ coordinate system including an X axis, a Y axis, and a Z axis which are orthogonal to each other is used.

Figure 1:
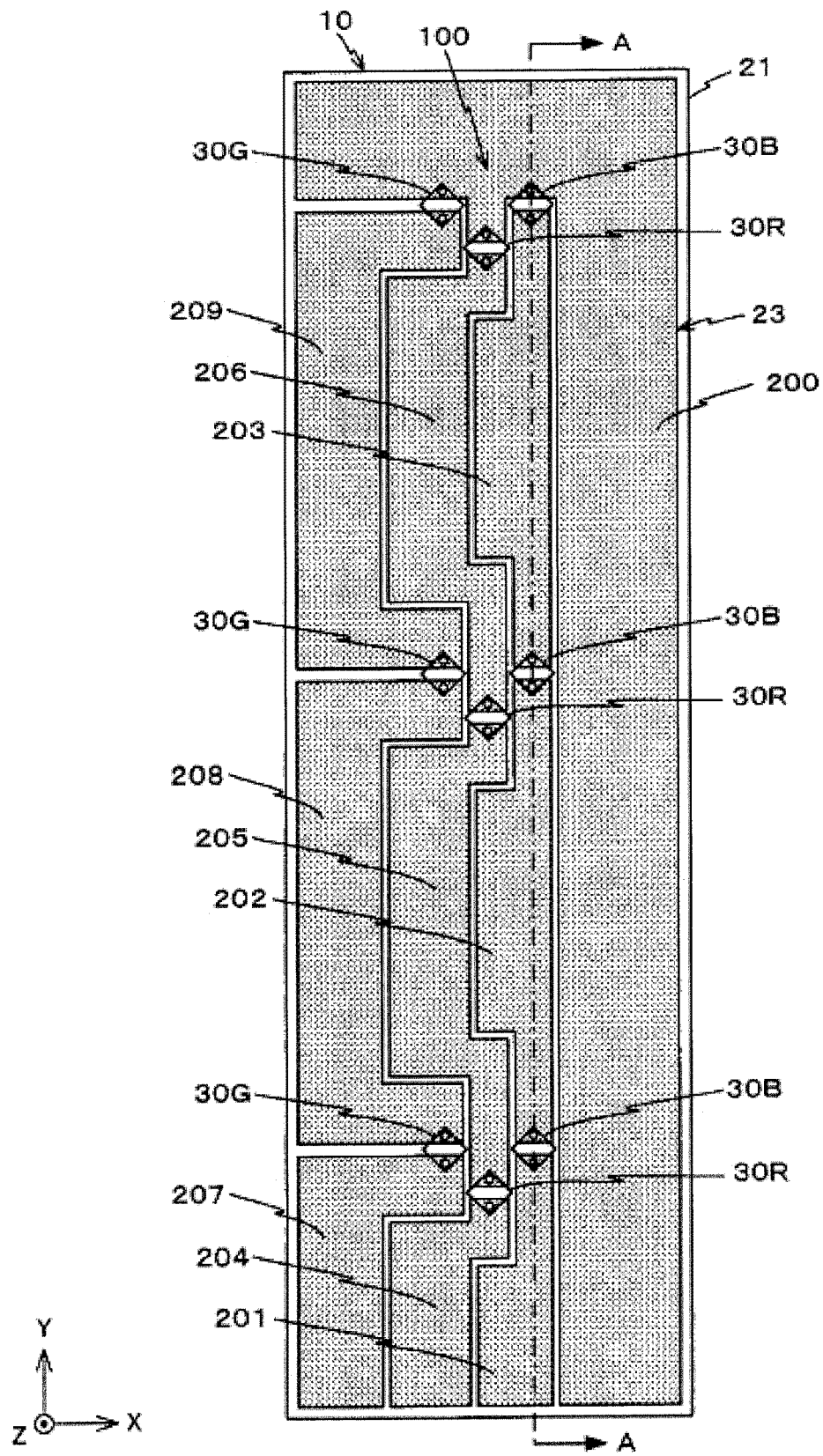
FIG. 1 is a plan view of a light emitting module according to a first embodiment.

FIG. 1 is a plan view of a light emitting module 10 according to the embodiment. As illustrated in FIG. 1, the light emitting module 10 is a module whose longitudinal direction is a Y axis direction. In the light emitting module 10, three light emitting elements 30R, 30G, 30B arranged close to each other are used as light sources.

Figure 2:
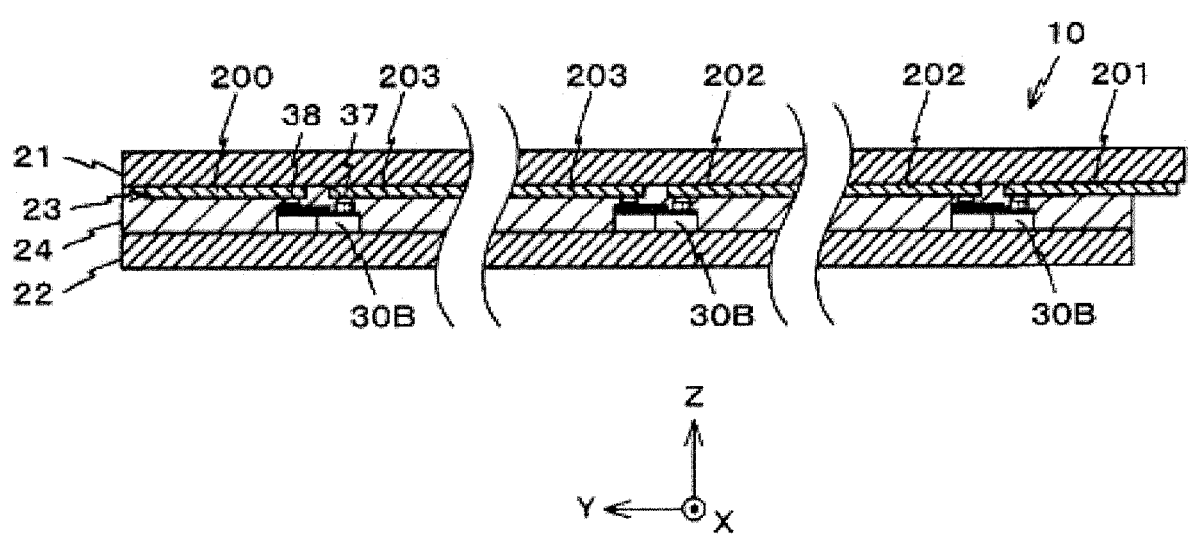
FIG. 2 is a sectional view of the light emitting module.

FIG. 2 is a view illustrating a cross section taken along line A-A of the light emitting module 10 in FIG. 1. As can be seen from FIG. 2, the light emitting module 10 includes a pair of transparent films 21, 22 (first and second insulating films), a resin layer 24 formed between the transparent films 21, 22, and light emitting elements 30R to 30B arranged inside the resin layer 24. In FIG. 2, only the light emitting element 30B is illustrated.

The transparent films 21, 22 are rectangular films whose longitudinal direction is the Y axis direction. The transparent films 21, 22 have a thickness of about 50 to 300 μm and are transparent to visible light. A total light transmittance of the transparent films 21, 22 is preferably about 5 to 95%. The total light transmittance refers to a total light transmittance measured according to Japanese Industrial Standard JIS K7375:2008.

The transparent films 21, 22 have flexibility, and a bending elastic modulus of the transparent films 21, 22 is about 0 to 320 kgf/mm$^2$ (excluding zero). The bending elastic modulus is a value measured by a method according to ISO178 (JIS K7171:2008).

As a material of the transparent films 21, 22, polyethylene terephthalate (PET), polyethylene naphthalate (PEN), polycarbonate (PC), polyethylene succinate (PES), ARTON, acrylic resin, or the like is considered to be used.

A conductor layer 23 having a thickness of about 0.05 μm to 10 μm is formed on a bottom surface (a surface on a –Z side in FIG. 2) of the transparent film 21 out of the pair of transparent films 21, 22. The conductor layer 23 is a deposited film or a sputtered film, for example. Further, the conductor layer 23 may be a layer to which a metallic film is attached by an adhesive. In a case in which the conductor layer 23 is a deposited film or a sputtered film, the thickness of the conductor layer 23 is about 0.05 μm to 2 μm. In a case in which the conductor layer 23 is a bonded metallic film, the thickness of the conductor layer 23 is about 2 μm to 10 μm or about 2 μm to 7 μm.

As illustrated in FIG. 1, the conductor layer 23 includes an L-shaped mesh pattern 200 formed along a +X side outer edge of the transparent film 21, mesh patterns 201, 202, 203 arranged along a –X side outer edge of the mesh pattern 200, mesh patterns 204, 205, 206 arranged on the –X side of the mesh patterns 201 to 203, and mesh patterns 207, 208, 209 arranged on the –X side of the mesh patterns 204 to 206. Each of the mesh patterns 200 to 209 is made of a metallic material such as copper (Cu) or silver (Ag).

Figure 3:
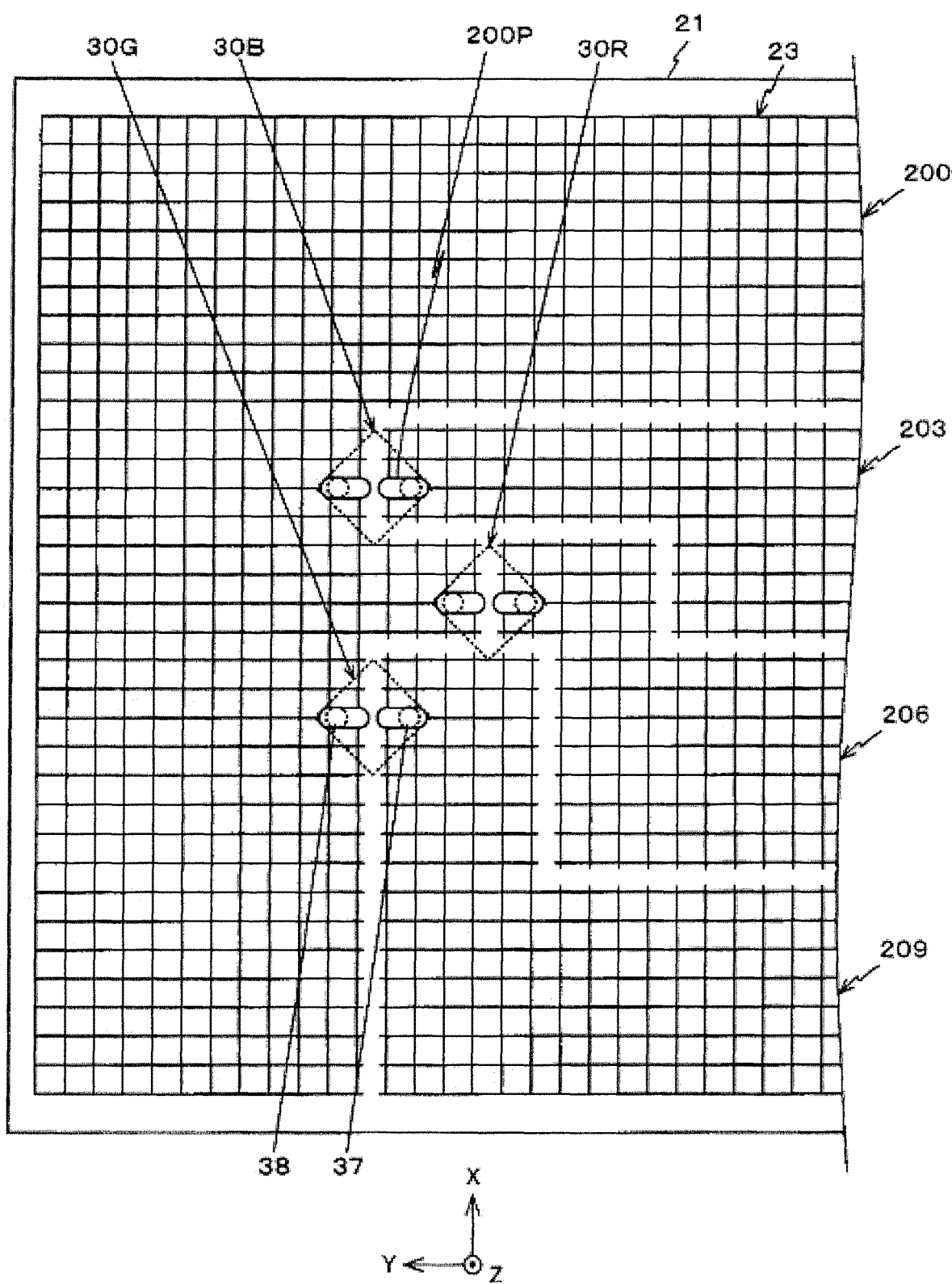
FIG. 3 is an enlarged view illustrating parts of mesh patterns.

FIG. 3 is an enlarged view illustrating parts of the mesh patterns 200, 203, 206, 209. As illustrated in FIG. 3, each of the mesh patterns 200 to 209 is made of a line pattern having a line width of about 10 μm. Line patterns parallel to the X axis are formed along the Y axis at intervals of about 300 μm. Further, line patterns parallel to the Y axis are formed along the X axis at intervals of about 300 μm. A connection pad 200P to which electrodes of the light emitting elements 30R, 30G, 30B are connected is formed in each of the mesh patterns 200 to 209.

As illustrated in FIG. 2, in the light emitting module 10, the transparent film 22 on the lower side is shorter in length in the Y axis direction than the transparent film 21. For this reason, –Y side end portions of the mesh patterns 200, 201, 204, 207 constituting the conductor layer 23 are exposed.

The resin layer 24 is formed between the transparent films 21, 22. The resin layer 24 has transparency to visible light.

Each of the light emitting elements 30R, 30G, 30B is a square LED chip whose one side is about 0.1 to 3 mm. Hereinafter, for convenience of description, the light emitting elements 30R, 30G, 30B are referred to collectively as a "light emitting element 30" as appropriate. In the embodiment, the light emitting elements 30R, 30G, 30B are bare chips. A rated current of the light emitting element 30 is about 50 mA.

Figure 4:
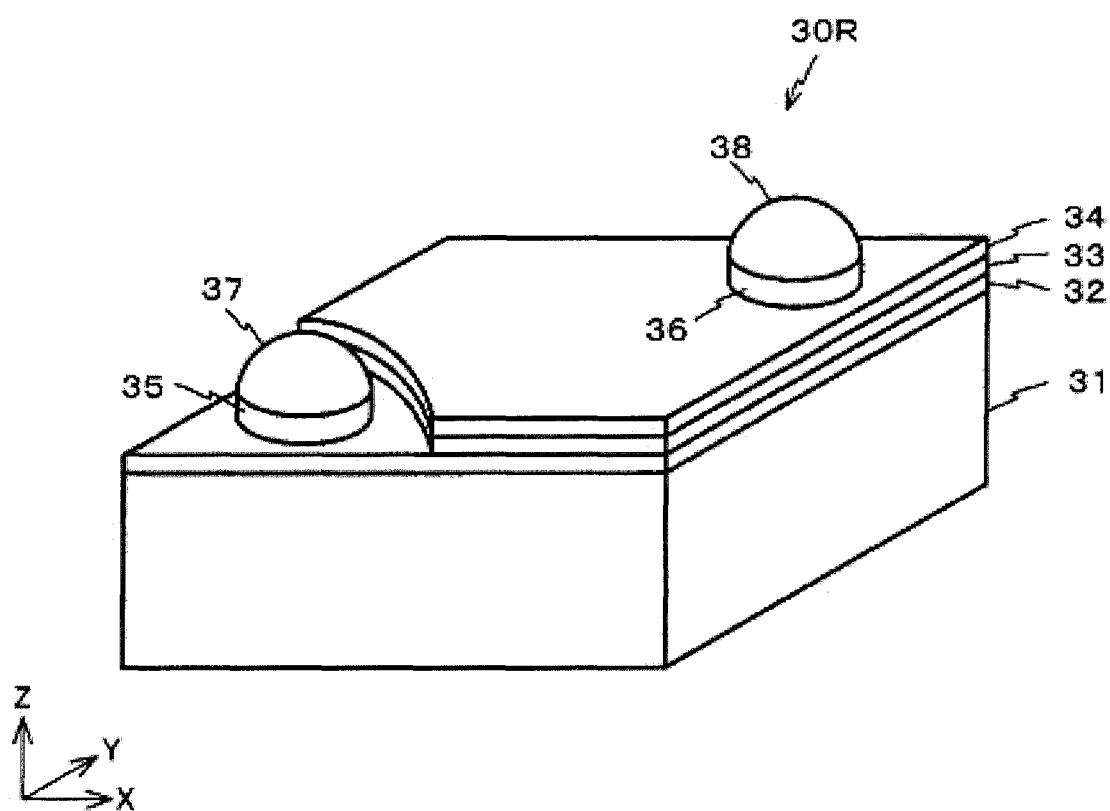
FIG. 4 is a perspective view of the light emitting element.

FIG. 4 is a perspective view illustrating the light emitting element 30R. As illustrated in FIG. 4, the light emitting element 30R is an LED chip including a base substrate 31, a P-type semiconductor layer 32, an active layer 33, and an N-type semiconductor layer 34.

The base substrate 31 is a square plate-like substrate made of sapphire, for example. The P-type semiconductor layer 32 having the same shape as the base substrate 31 is formed on the top surface of the base substrate 31. The active layer 33 and the N-type semiconductor layer 34 are sequentially stacked on the top surface of the P-type semiconductor layer 32. Each of the P-type semiconductor layer 32, the active layer 33, and the N-type semiconductor layer 34 is made of a compound semiconductor material. For example, as a light emitting element that emits red light, an InAlGaP-based material can be used as the active layer. The active layer may be a double hetero (DH) junction structure or a multiple quantum well (MQW) structure. Further, the active layer may be a PN junction configuration.

In the active layer 33 and the N-type semiconductor layer 34 stacked on the P-type semiconductor layer 32, a notch is formed at a corner portion on the –Y side and the –X side. The surface of the P-type semiconductor layer 32 is exposed from the notch of the active layer 33 and the N-type semiconductor layer 34.

An electrode pad 35 electrically connected to the P-type semiconductor layer 32 is formed in a region of the P-type semiconductor layer 32 exposed from the active layer 33 and the N-type semiconductor layer 34. Further, an electrode pad 36 electrically connected to the N-type semiconductor layer 34 is formed at a corner portion of the N-type semiconductor layer 34 on the +X side and the +Y side. Each of the electrode pads 35, 36 is made of copper (Cu) or gold (Au). A bump 37 is formed on the top surface of the electrode pad 35, and a bump 38 is formed on the top surface of the electrode pad 36. Each of the bumps 37, 38 is made of a metallic bump such as gold (Au) or gold alloy. A solder bump formed in a hemisphere shape may be used instead of the metallic bump. In the light emitting element 30R, the bump 37 functions as an anode electrode, and the bump 38 functions as a cathode electrode.

Figure 5:
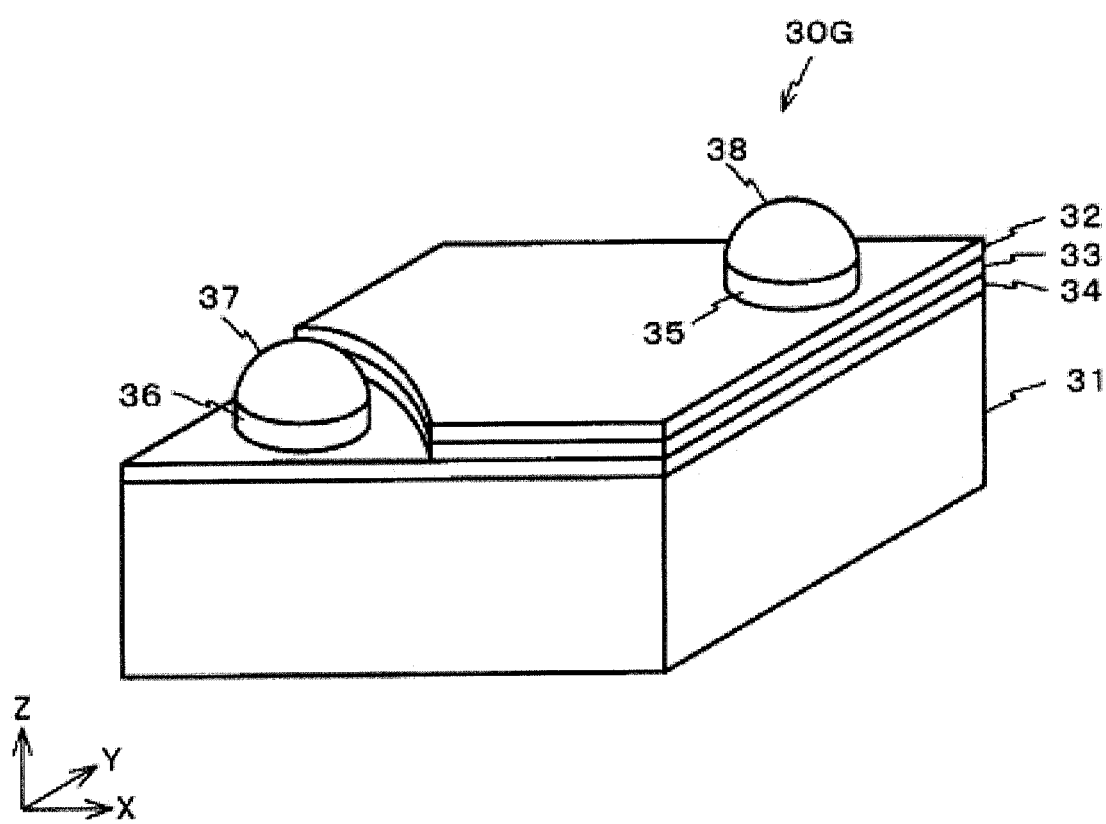
FIG. 5 is a perspective view of the light emitting element.

FIG. 5 is a perspective view illustrating the light emitting element 30G. As illustrated in FIG. 5, the light emitting element 30G is an LED chip including the base substrate 31, the N-type semiconductor layer 34, the active layer 33, and the P-type semiconductor layer 32.

The N-type semiconductor layer 34 having the same shape as the base substrate 31 is formed on the top surface of the base substrate 31. The active layer 33 and the P-type semiconductor layer 32 are sequentially stacked on the top surface of the N-type semiconductor layer 34. Each of the N-type semiconductor layer 34, the active layer 33, and the P-type semiconductor layer 32 is made of a compound semiconductor material. For example, as a light emitting element that emits blue light or green light, a GaN-based semiconductor can be used as the P-type semiconductor layer 32 and the N-type semiconductor layer 34, and an InGaN-based semiconductor can be used as the active layer 33. The active layer may be a double hetero (DH) junction structure or a multiple quantum well (MQW) structure. Further, the active layer may be a PN junction configuration.

In the active layer 33 and the P-type semiconductor layer 32 stacked on the N-type semiconductor layer 34, a notch is formed at a corner portion on the −Y side and the −X side. The surface of the N-type semiconductor layer 34 is exposed from the notch of the active layer 33 and the P-type semiconductor layer 32.

An electrode pad 36 electrically connected to the N-type semiconductor layer 34 is formed in a region of the N-type semiconductor layer 34 exposed from the active layer 33 and the P-type semiconductor layer 32. An electrode pad 35 electrically connected to the P-type semiconductor layer 32 is formed on a corner portion of the P-type semiconductor layer 32 on the +X side and the +Y side. A bump 38 is formed on the top surface of the electrode pad 35, and a bump 37 is formed on the top surface of the electrode pad 36. In the light emitting element 30G, the bump 38 functions as an anode electrode, and the bump 37 functions as a cathode electrode.

The light emitting element 30B also has the same configuration as the light emitting element 30G. In the embodiment, the light emitting element 30R emits red light. Further, the light emitting element 30G emits green light, and the light emitting element 30B emits blue light. Specifically, the light emitting element 30R emits light having a peak wavelength of about 600 nm to 700 nm. In addition, the light emitting element 30G emits light having a peak wavelength of about 500 nm to 550 nm. The light emitting element 30B emits light having a peak wavelength of about 450 nm to 500 nm.

Figure 6:
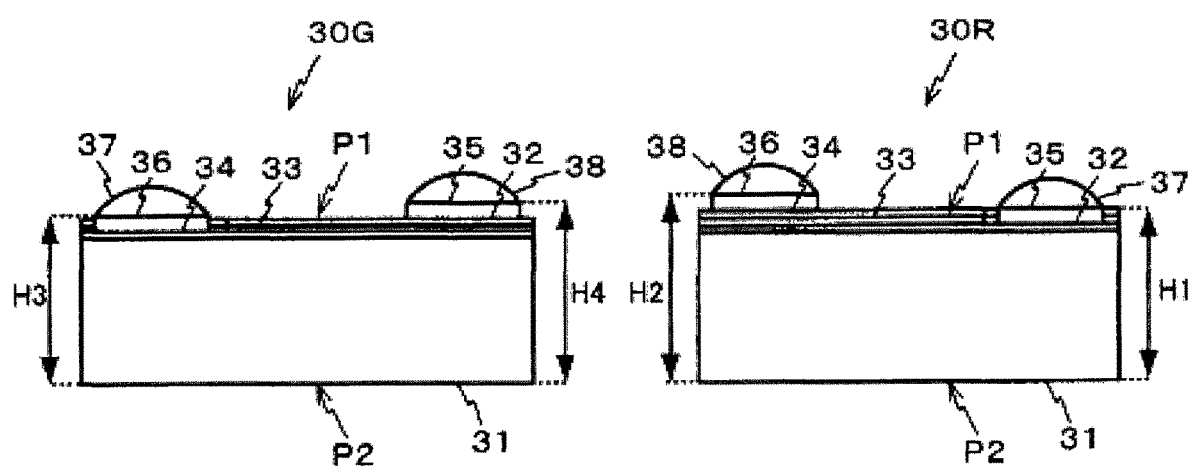
FIG. 6 is a diagram illustrating two light emitting elements in a comparable manner.
Figure 6:
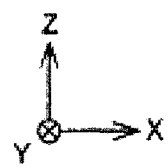

FIG. 6 is a diagram illustrating the light emitting element 30R and the light emitting element 30G in a comparable manner. As illustrated in FIG. 6, the light emitting element 30R is slightly thicker than the light emitting element 30G. In the light emitting element 30R, the electrode pads 35, 36 are formed on a top surface P1 (a first surface) of the light emitting element 30R. Further, the electrode pad 35 is formed on the top surface of the P-type semiconductor layer 32, and the electrode pad 36 is formed on the top surface of the N-type semiconductor layer 34 formed on the P-type semiconductor layer 32 with the active layer 33 interposed therebetween. Therefore, a height H2 from a bottom surface P2 (a second surface) of the light emitting element 30R to the electrode pad 36 is higher than a height H1 from the bottom surface P2 to the electrode pad 35. A difference between the height H1 and the height H2 is about 3.5 μm to 5 μm corresponding to the thickness of the active layer 33 and the N-type semiconductor layer 34.

In the light emitting element 30G, the electrode pads 35, 36 are formed on a top surface P1 of the light emitting element 30R. Further, the electrode pad 36 is formed on the top surface of the N-type semiconductor layer 34, and the electrode pad 35 is formed on the top surface of the P-type semiconductor layer 32 formed on the N-type semiconductor layer 34 with the active layer 33 interposed therebetween. Therefore, a height H4 from the bottom surface P2 to the electrode pad 35 is higher than a height H3 from the bottom surface P2 of the light emitting element 30G to the electrode pad 36. A difference between the height H3 and the height H4 is about 3 μm to 4 μm corresponding to the thickness of the active layer 33 and the N-type semiconductor layer 34.

For the electrode pads 35, 36 of the light emitting element 30B, similarly, the height H4 from the bottom surface P2 to the electrode pad 35 is higher than the height H3 from the bottom surface P2 of the light emitting element 30B to the electrode pad 36.

The dimensions of the light emitting element 30R in the X axis direction and the Y axis direction are smaller than those of the light emitting element 30G in the X axis direction and the Y axis direction. For example, the dimensions of the light emitting element 30R in the X axis direction and the Y axis direction are 0.3 mm, and the dimensions of the light emitting elements 30G, 30B in the X axis direction and the Y axis direction are 0.385 mm.

As can be seen from FIG. 3, each of the light emitting elements 30R, 30G, 30B is arranged between two mesh patterns as the bump 37, 38 are connected to the connection pad 200P formed in the mesh patterns 200 to 209.

In the light emitting module 10, as illustrated in FIG. 1, the three light emitting elements 30R are arranged between the mesh pattern 204 and the mesh pattern 205, between the mesh pattern 205 and the mesh pattern 206, and between the mesh pattern 206 and the mesh pattern 200. Further, the three light emitting elements 30G are arranged between the mesh pattern 207 and the mesh pattern 208, between the mesh pattern 208 and the mesh pattern 209, and between the mesh pattern 209 and the mesh pattern 200. Further, the three light emitting elements 30B are arranged between the mesh pattern 201 and the mesh pattern 202, between the mesh pattern 202 and the mesh pattern 203, and between the mesh pattern 203 and the mesh pattern 200.

Accordingly, the light emitting element 30R and the mesh patterns 200, 204 to 206 are connected in series. Similarly, the light emitting element 30G and the mesh patterns 200, 207 to 209 are connected in series, and the light emitting element 30B and the mesh patterns 200, 201 to 203 are connected in series. As illustrated in FIG. 1, in the light emitting module 10, the three light emitting elements 30R, 30G, 30B constitute a light emitting element group 100.

Figure 7:
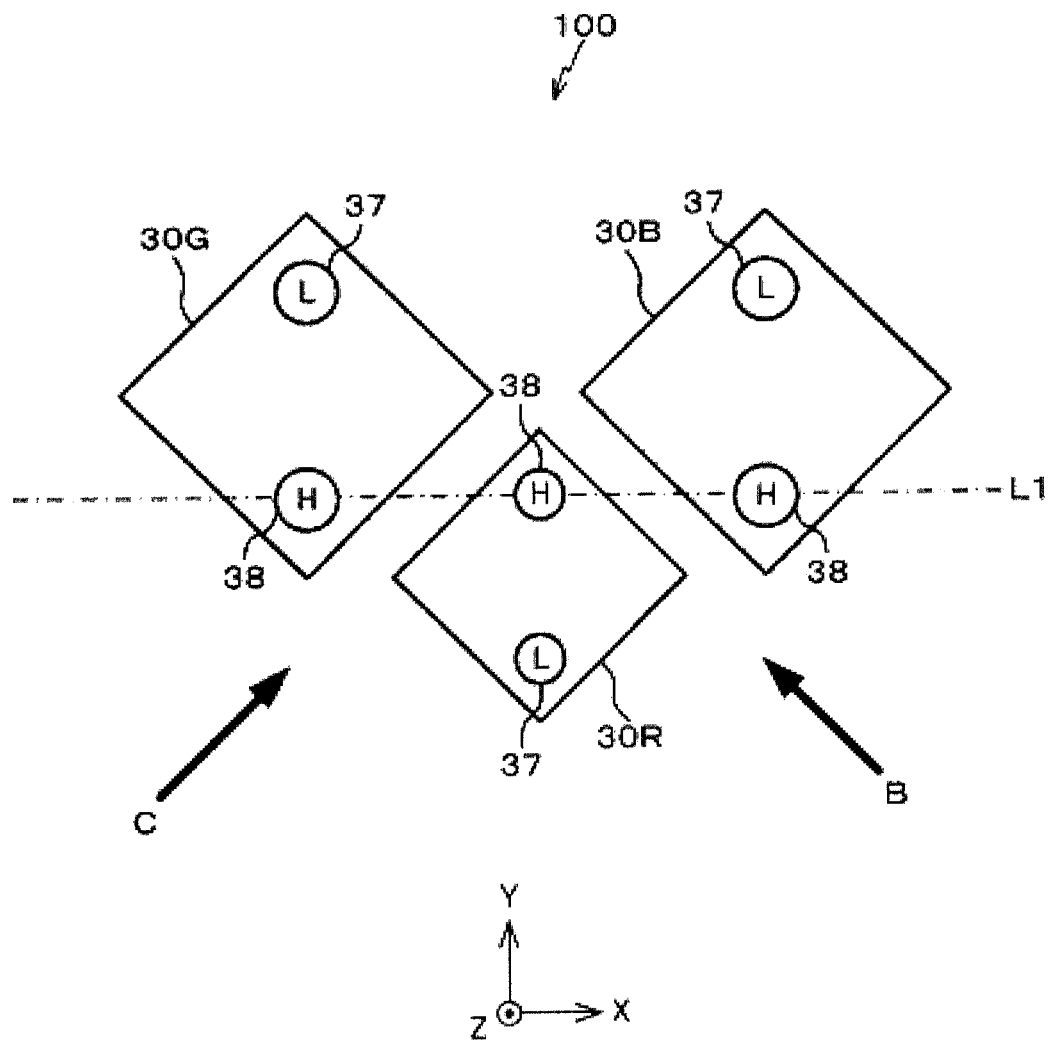
FIG. 7 is a diagram illustrating an arrangement of light emitting elements constituting a light emitting element group.

FIG. 7 is a diagram illustrating the light emitting elements 30R, 30G, 30B constituting the light emitting element group 100. H and L written in the bumps 37, 38 in FIG. 7 indicate the heights of the bumps 37 and 38 (the positions in the Z axis direction), respectively. Of the two bumps of the light emitting element, the bump with H is higher than the bump with L.

As illustrated in FIG. 7, the light emitting elements 30R, 30G, 30B constituting the light emitting element group 100 are arranged such that the electrode pads having the higher arrangement position out of a pair of electrode pads 35, 36 are closer to each other. In other words, the arrangement is performed such that the bumps 38 of the light emitting elements 30G, 30B are closer to the bump 38 of the light emitting element 30R than the bumps 37 of the light emitting elements 30G, 30B. Specifically, the bump 38 of the light emitting element 30R and the bumps 38 of the light emitting elements 30G, 30B are arranged along a straight line L1 indicated by an imaginary line.

Figure 8:
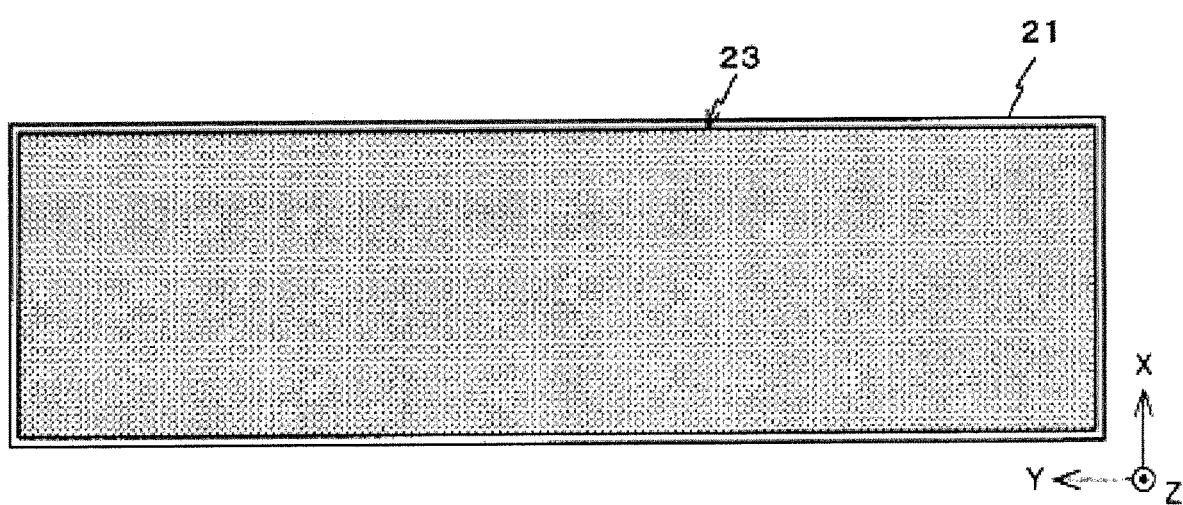
FIG. 8 is a diagram for describing a manufacturing method of the light emitting module.
Figure 9:
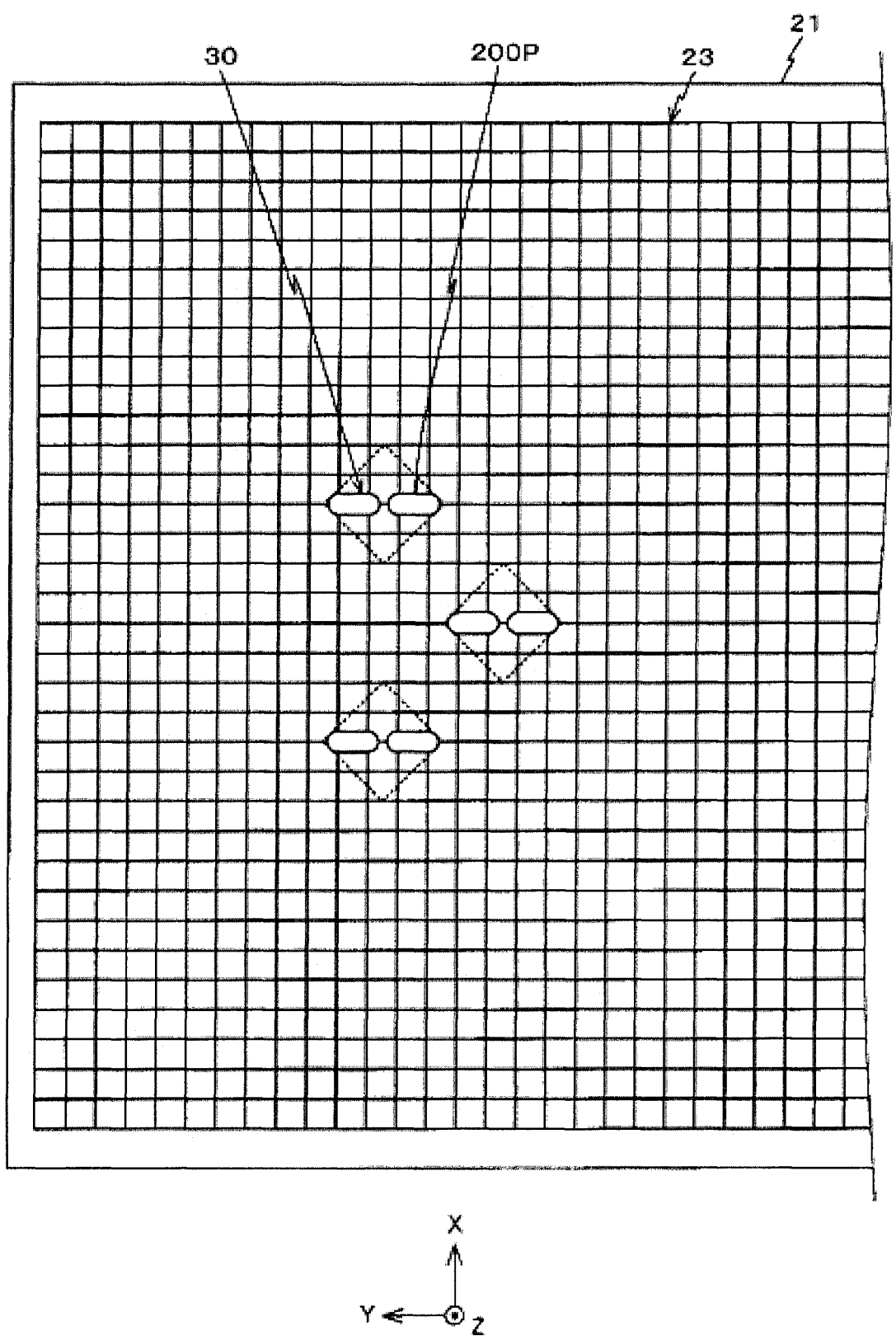
FIG. 9 is a diagram for describing the manufacturing method of the light emitting module.

Next, a manufacturing method of the light emitting module 10 will be described. First, a transparent film 21 made of PET is prepared. Then, as illustrated in FIG. 8, a mesh-like conductor layer 23 is formed on the entire surface of the transparent film 21 by a subtractive technique, an additive technique, or the like. FIG. 9 is an enlarged view illustrating a part of the conductor layer 23. As illustrated in FIG. 9, in the conductor layer 23 at this time, portions which become the mesh patterns 200 to 209 are integrally formed. The connection pad 200P is formed in the conductor layer 23 at a position at which the light emitting elements 30R, 30G, 30B are installed.

Then, the conductor layer 23 is cut with laser to form the mesh patterns 200 to 209. The cutting of the conductor layer 23 is performed by irradiating the conductor layer 23 formed on the surface of the transparent film 21 with laser light. Then, the laser spot of the laser light is moved along broken lines illustrated in FIG. 10. Accordingly, the conductor layer 23 is cut along broken lines, and the mesh patterns 200 to 209 are formed as illustrated in FIG. 11.

Figure 10:
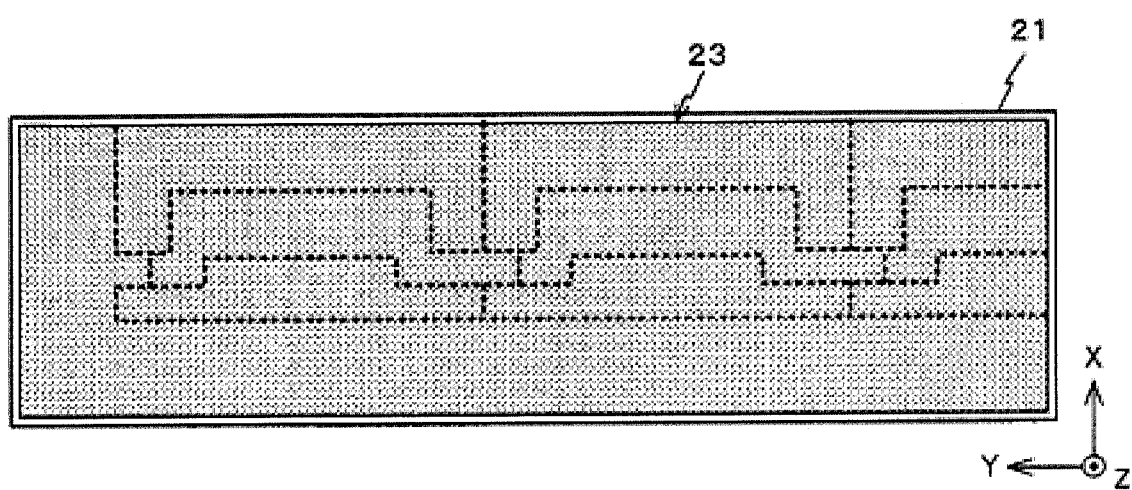
FIG. 10 is a diagram for describing the manufacturing method of the light emitting module.
Figure 11:
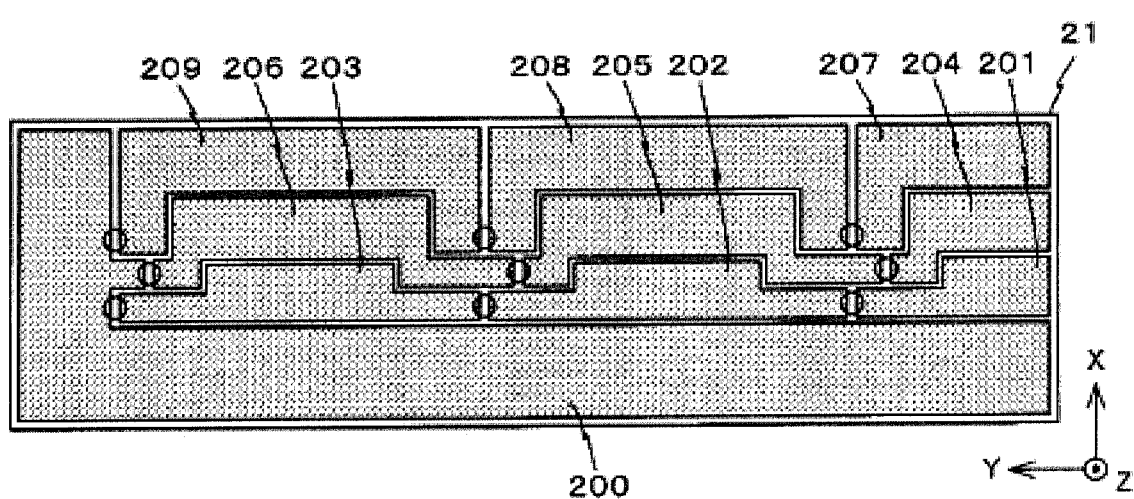
FIG. 11 is a diagram for describing the manufacturing method of the light emitting module.

If the laser spot of the laser light moves on the surface of the conductor layer 23 along the broken lines illustrated in FIG. 10, a portion near the movement path of the laser spot is melted and sublimated. Accordingly, as illustrated in FIG. 3, the mesh patterns 200 to 209 are cut out, and the connection pads 200P formed at adjacent positions are electrically separated from each other. In the light emitting module 10, a pair of connection pads 200P are formed at sites illustrated by circles in FIG. 11.

Figure 12:
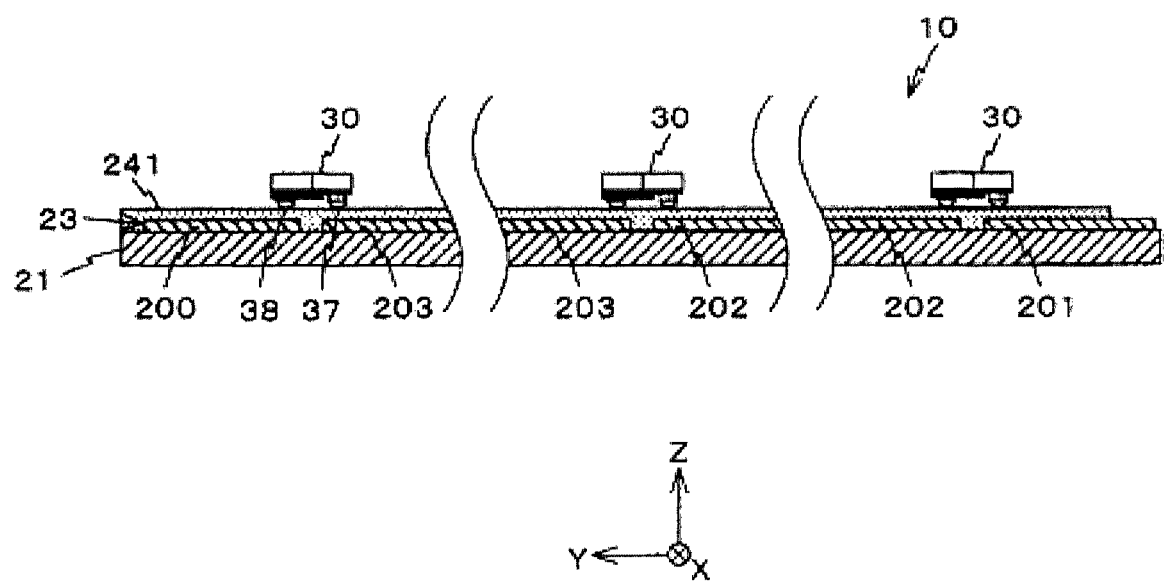
FIG. 12 is a diagram for describing the manufacturing method of the light emitting module.

Then, as illustrated in FIG. 12, thermosetting resin 241 is formed on the surface of the transparent film 21 on which the mesh patterns 200 to 209 are formed. The thickness of the thermosetting resin 241 is approximately equal to the height of the bumps 37, 38 of the light emitting element 30. In the embodiment, the thermosetting resin 241 is a resin film and is arranged on the surface of the transparent film 21. As a material of the thermosetting resin 241, an epoxy resin is used, for example.

Then, the light emitting element 30 is arranged on the thermosetting resin 241. At this time, the light emitting element 30 is positioned so that the connection pads 200P formed in the mesh patterns 200 to 209 are positioned directly below the bumps 37, 38 of the light emitting element 30.

Figure 13:
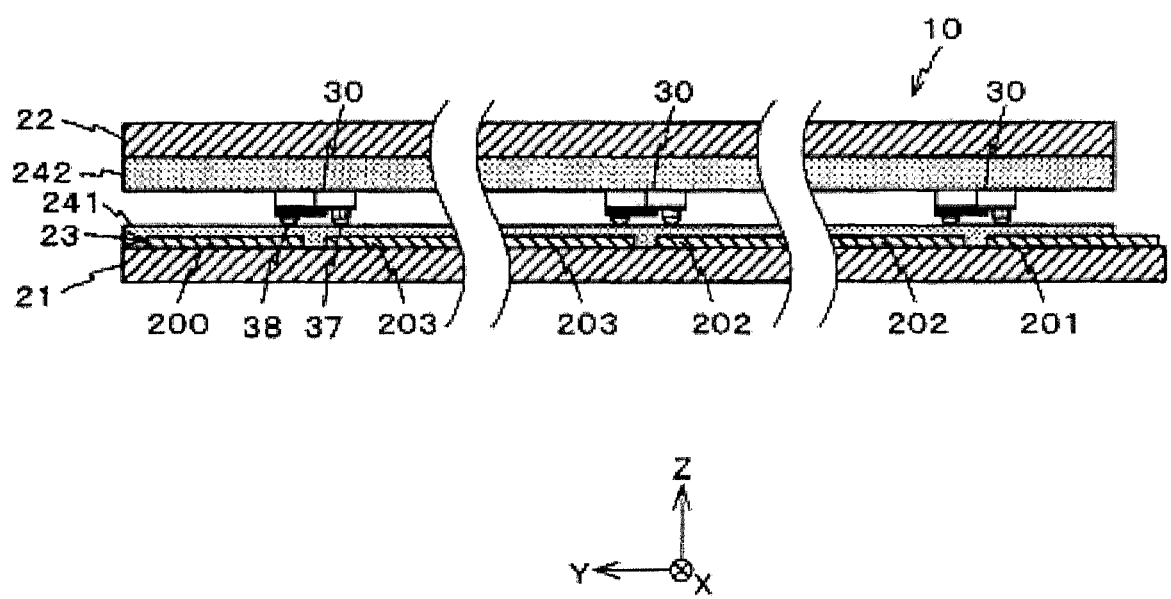
FIG. 13 is a diagram for describing the manufacturing method of the light emitting module.

Then, as illustrated in FIG. 13, a transparent film 22 in which a film made of thermosetting resin 242 is attached to the bottom surface is arranged on the top surface side of the transparent film 21.

Then, each of the transparent films 21, 22 is heated and pressed in a vacuum atmosphere. Accordingly, first, the bumps 37, 38 formed in the light emitting element 30 penetrate the thermosetting resin 241, reach the conductor layer 23, and are electrically connected to the mesh patterns 200 to 209. Then, the periphery of the light emitting element 30 is filled with the thermosetting resin 241 and the thermosetting resin 242 without gaps, and the thermosetting resin 241 and the thermosetting resin 242 are heated and cured. Accordingly, the thermosetting resin 241 and the thermosetting resin 242 become the resin layer 24 which holds the light emitting element 30 between the transparent films 21, 22 as illustrated in FIG. 2. The light emitting module 10 is completed through the above steps.

Figure 14:
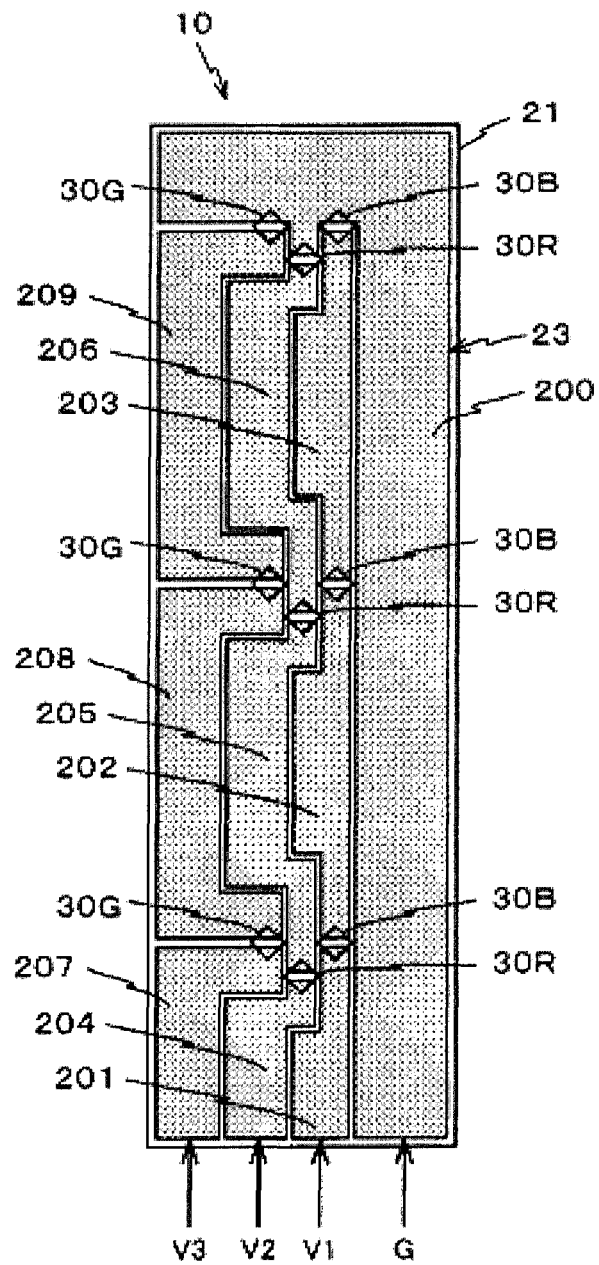
FIG. 14 is a diagram for describing an operation of the light emitting module.

In the light emitting module 10 configured as described above, as illustrated in FIG. 14, voltages V1, V2, V3 are applied to the mesh patterns 201, 204, 207 using the mesh pattern 200 as a plus side common pattern. Accordingly, the light emitting elements 30R, 30G, 30B emit light. Red (R), green (G), and blue (B) lights emitted from the light emitting elements 30R, 30G, 30B are mixed, and it appears to human eyes that the light emitting module 10 emits white light.

Figure 15:
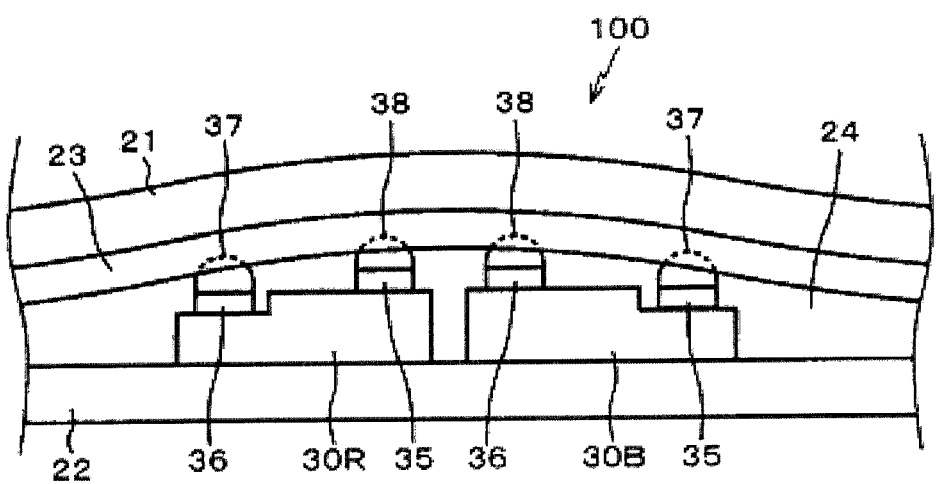
FIG. 15 is a side view of the light emitting element group.
Figure 16:
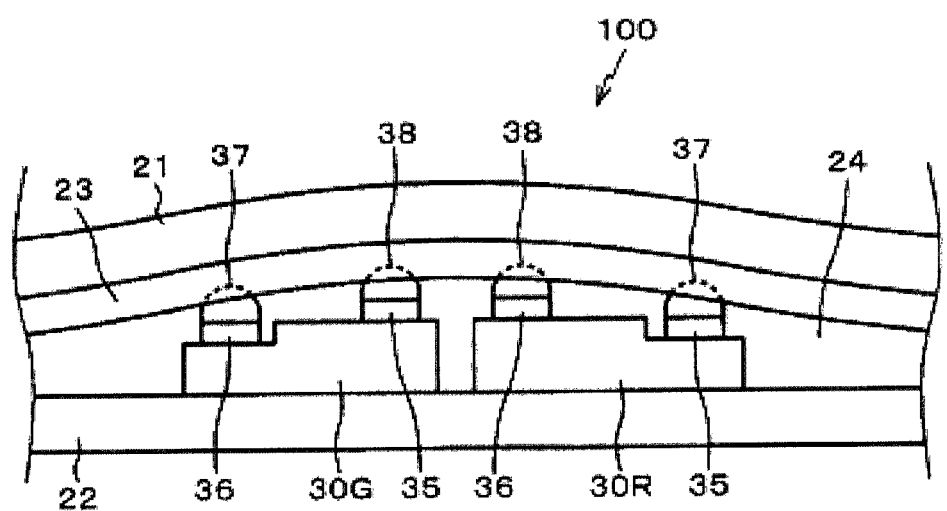
FIG. 16 is a side view of the light emitting element group.

FIG. 15 illustrates the light emitting element group 100 viewed in a direction indicated by an arrow B in FIG. 7. Further, FIG. 16 illustrates the light emitting element group 100 viewed in a direction indicated by an arrow C in FIG. 7. As illustrated in FIGS. 15 and 16, when the transparent films 21, 22 are clamped, the transparent film 21 is pressed upward via the conductor layer 23 by the light emitting elements 30R, 30G, 30B arranged between the transparent films 21, 22. Accordingly, the conductor layer 23 deforms so that the vicinities of the light emitting elements 30R, 30G, 30B are curved outward. As illustrated in FIG. 7, when the light emitting elements 30G, 30B are arranged to be adjacent to each other in the light emitting element 30R, the vicinity of the bump 38 of the light emitting element 30R protrudes outermost (upward).

As illustrated in FIG. 7, the light emitting elements 30R, 30G, 30B are arranged so that the bumps 38 of the light emitting elements 30G, 30B are closer to the bump 38 of the light emitting element 30R than the bumps 37 of the light emitting elements 30G, 30B. Accordingly, as illustrated in FIGS. 15 and 16, the bump 38 of the light emitting element 30R and the bumps 38 of the light emitting elements 30G, 30B are arranged in the vicinity of the outermost protruding portion of the conductor layer 23, and the bump 37 of the light emitting element 30R and the bumps 37 of the light emitting elements 30G, 30B arranged at positions lower than the bump 38 are arranged away from the protruding portion of the conductor layer 23. Further, the bump 38 of the light emitting element 30R formed at the highest position is arranged at a position closest to the protruding portion. Accordingly, the bumps 37, 38 of the light emitting elements 30R, 30G, 30B have different heights but bite into the conductor layer 23 formed in the transparent film 21 at the same depth. Therefore, it is possible to reliably electrically connect all the electrode pads 35, 36 of the light emitting elements 30R, 30G, 30B to the conductor layer 23 via the bumps 37, 38.

Figure 17:
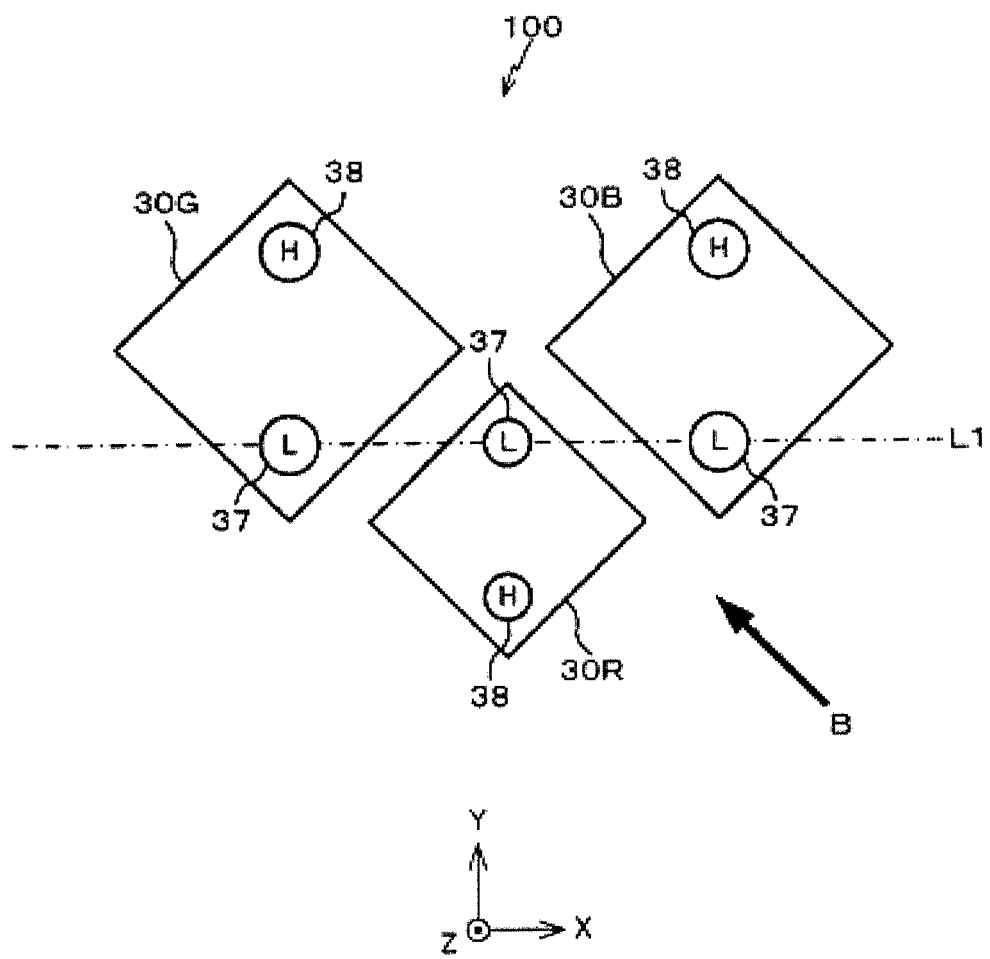
FIG. 17 is a diagram illustrating an arrangement of light emitting elements constituting a light emitting element group according to a comparative example.
Figure 18:
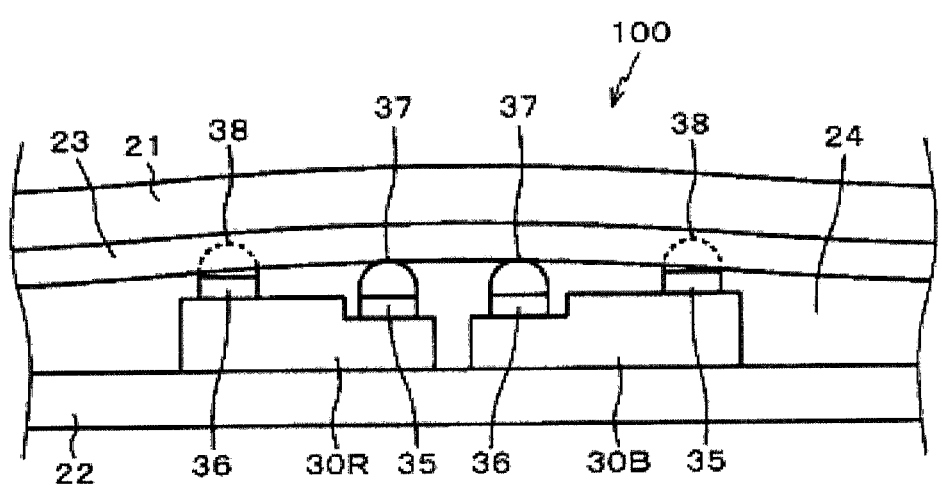
FIG. 18 is a side view of the light emitting element group according to the comparative example.

For example, in the comparative example illustrated in FIG. 17, the light emitting elements 30R, 30G, 30B are arranged so that the bumps 37 of the light emitting elements 30G, 30B are closer to the bump 37 of the light emitting element 30R than the bumps 38 of the light emitting elements 30G, 30B. Accordingly, as can be seen from FIG. 18, the bump 37 of the light emitting element 30R and the bumps 37 of the light emitting elements 30G, 30B are arranged in the vicinity of the outermost protruding portion of the conductor layer 23, and the bump 38 of the light emitting element 30R and the bumps 38 of the light emitting element 30G, 30B arranged at positions higher than the bump 37 are arranged away from the protruding portion of the conductor layer 23. Therefore, the bumps 38 of the light emitting elements 30R, 30G, 30B deeply bite into the conductor layer 23 formed on the transparent film 21, but the bumps 37 of the light emitting elements 30R, 30G, 30B do not sufficiently bite into the conductor layer 23.

In this case, it is considered that a contact failure occurs between the bump 37 and the conductor layer 23. Further, it is considered that the bump 38 penetrates the conductor layer 23, and a contact failure or a dielectric breakdown may occur between the bump 37 and the conductor layer 23, accordingly.

Next, an evaluation result of a contact state between the bumps 37, 38 of the light emitting elements 30R, 30G, 30B and the conductor layer 23 will be described. A contact area between the bumps 37, 38 and the conductor layer 23 increases as the bumps 37, 38 deeply bites into the conductor layer 23. Here, a contact state between the bumps 37, 38 of the light emitting elements 30R, 30G, 303 and the conductor layer 23 is evaluated using the contact area between the bumps 37, 38 and the conductor layer 23 as a parameter.

Figure 19:
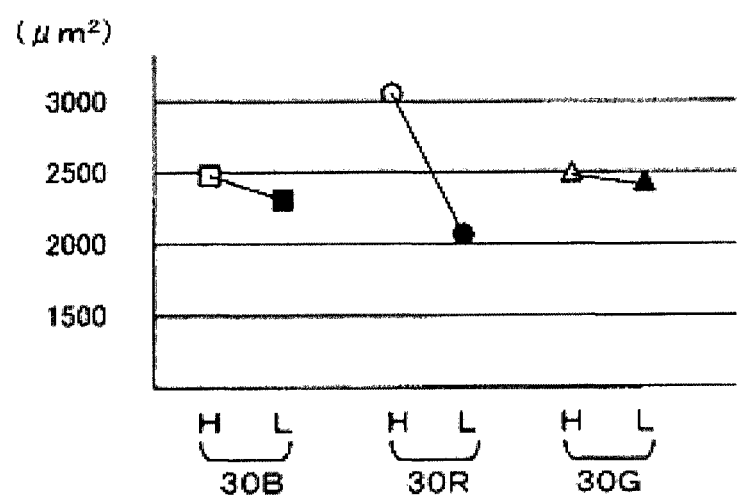
FIG. 19 is a diagram illustrating an evaluation result of the light emitting module according to the first embodiment.

FIG. 19 illustrates, as an example, an evaluation result of the light emitting module 10 according to the embodiment in which the bumps 38 of the light emitting elements 30R, 30G, 30B are linearly arranged as illustrated in FIG. 7. A vertical axis indicates the contact area between the bump and the conductor layer. A horizontal axis indicates the bumps 37, 38 of light emitting elements 30R, 30G and 30B, H indicates the bump 38, and L indicates the bump 37.

As illustrated in FIG. 19, the contact area between the bump 38 of the light emitting element 30B and the conductor layer 23 was about 2500 µm², and the contact area between the bump 37 and the conductor layer 23 was about 2300 µm². Further, a difference in contact area between the bumps 37, 38 was about 200 µm². The contact area between the bump 38 of the light emitting element 30R and the conductor layer 23 was about 3000 µm², and the contact area between the bump 37 and the conductor layer 23 was about 2100 µm². Further, a difference in contact area between the bumps 37, 38 was about 900 µm². The contact area between the bump 38 of the light emitting element 30G and the conductor layer 23 was about 2500 µm², and the contact area between the bump 37 and the conductor layer 23 was about 2400 µm². Further, a difference in contact area between the bumps 37, 38 was about 100 µm². In the light emitting module 10 according to the embodiment, the variation (difference) in the contact area between the bump and the conductor layer is suppressed to be 1000 µm² or less.

Figure 20:
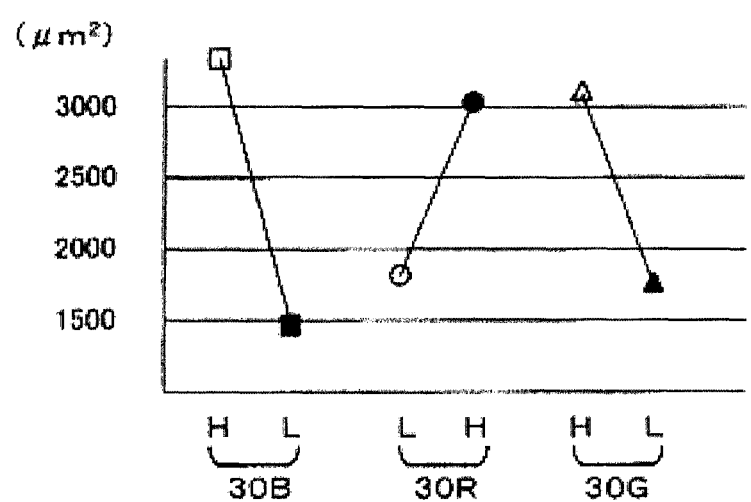
FIG. 20 is a diagram illustrating an evaluation result of a light emitting module according to the comparative example.

Next, FIG. 20 illustrates, as an example, an evaluation result of a light emitting module according to a comparative example in which the bumps 37 of the light emitting elements 30R, 30G, 30B are linearly arranged as illustrated in FIG. 17.

As illustrated in FIG. 20, the contact area between the bump 38 of the light emitting element 30B and the conductor layer 23 was about 3300 µm², and the contact area between the bump 37 and the conductor layer 23 was about 1500 µm². Further, a difference in contact area between the bumps 37, 38 was about 1800 µm². The contact area between the bump 38 of the light emitting element 30R and the conductor layer 23 was about 3000 µm², and the contact area between the bump 37 and the conductor layer 23 was about 1800 µm². Further, a difference in contact area between the bumps 37, 38 was about 1200 µm². The contact area between the bump 38 of the light emitting element 30G and the conductor layer 23 was about 3100 µm², and the contact area between the bump 37 and the conductor layer 23 was about 1700 µm². Further, a difference in contact area between the bumps 37, 38 was about 1400 µm². In the light emitting module according to the comparative example, the variation in the contact area between the bump and the conductor layer exceeds 1000 µm².

As described above, in the light emitting module 10 according to the embodiment, the electrode pads of the light emitting elements 30R, 30G, 30B arranged at high positions are arranged close to each other, and thus the variation in the contact area between the bumps 37, 38 to be provided on the electronic pad and the conductor layer 23 is understood to be suppressed. Therefore, it is possible to suppress the variations in the connection strength between the light emitting elements 30R, 30G, 30B and the conductor layer 23. Accordingly, it is possible to prevent the contact failure caused due to the insufficient contact between the bump and the conductor layer and the contact failure, the dielectric breakdown, or the like caused by excessive biting from occurring.

Note that the arrangement of the light emitting elements illustrated in FIG. 7 is an example. There are a plurality of arrangements of the light emitting elements 30R, 30G, 30B in which the bumps 38 are arranged in a line in the center of the light emitting element group 100. For example, the bumps 38 may be arranged in a line in the order of the light emitting element 30B, the light emitting element 30G, and the light emitting element 30R if a wiring pattern is allowed to be complicated.

<<First Modification>>

Figure 21:
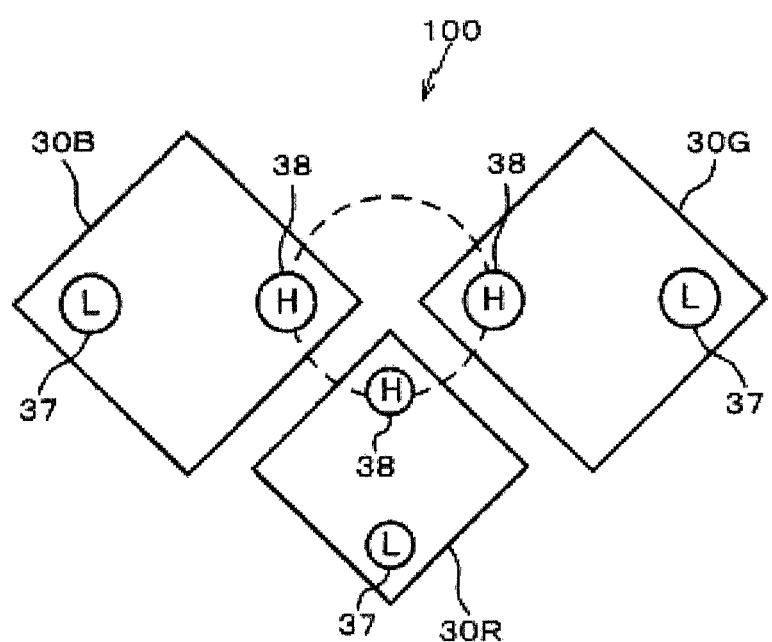
FIG. 21 is a diagram illustrating an arrangement of light emitting elements constituting a light emitting element group according to a first modification.

In the description of the first embodiment, a case in which the light emitting elements 30R, 30G, 30B are arranged so that the bumps 38 of the light emitting elements 30R, 30G, 30B are arranged in a line as illustrated in FIG. 7 has been described. However, the arrangement of the light emitting elements is not limited to the case illustrated in FIG. 7. For example, the bumps 38 of the light emitting elements 30R, 30G, 30B may be arranged on the same circumference as illustrated in FIG. 21. If the light emitting elements are arranged in this manner, the wiring pattern by the conductor layer 23 may be complicated. However, it is possible to reduce the variations in the contact areas between the bumps 38, 37 of the light emitting elements 30R, 30G, 30B and the conductor layer 23. Therefore, it is possible to simultaneously prevent the contact failure between the bump and the conductor layer and the dielectric breakdown caused by excessive biting, and it is possible to enhance the reliability of the light emitting module 10.

<<Second Modification>>

Figure 22:
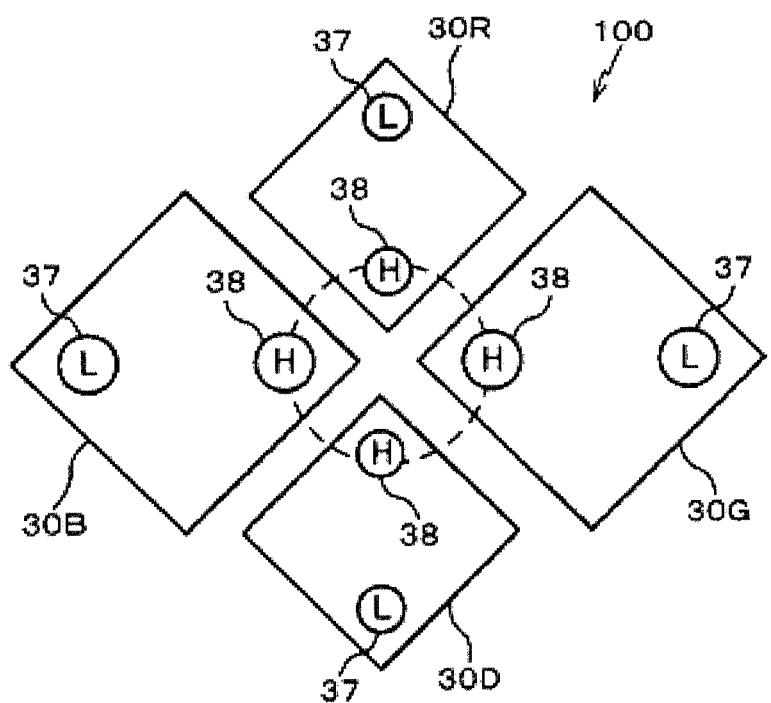
FIG. 22 is a diagram illustrating an arrangement of light emitting elements constituting a light emitting element group according to a second modification.

Further, a dummy light emitting element 30D to which no voltage is applied may be arranged as illustrated in FIG. 22. As the dummy light emitting element 30D, the light emitting element 30R is used, for example. Four light emitting elements, that is, the light emitting elements 30R, 30G, 30B, 30D are arranged so as to be positioned symmetrically on left, right, upper, and lower sides with respect to the center of the circumference. Since the dummy light emitting element 30D is arranged in this manner, a mortar-like depression in which a central portion of a region surrounded by the bumps 38 of the respective light emitting elements serves as a vertex, and which is symmetrical on left, right, upper, and lower sides in the drawing is formed in the conductor layer 23. Accordingly, the leading ends of the bumps 38 of the four light emitting elements can be arranged on the same circumference located at the same depth of the depression. Further, the leading ends of the bumps 37 of the four light emitting elements can be arranged on the same circumference located at another depth of the depression. Therefore, it is possible to further reduce the variation in the contact area between the bumps 37, 38 and the conductor layer 23. Accordingly, it is possible to simultaneously prevent the contact failure caused due to the insufficient contact and the dielectric breakdown caused by excessive biting, and it is possible to further enhance the reliability of the light emitting module 10.

In the above description, a voltage is not applied to the dummy light emitting element 30D, but a voltage may be applied to the dummy light emitting element 30D in a case in which the color balance of RGB is not disturbed. Further, a voltage may be applied to all the light emitting elements in a case in which the light emitting element group 100 is constituted by light emitting elements of a single color.

Second Embodiment

In the above embodiment, the technique for reducing the variations in the contact area between the bumps 37, 38 of the respective light emitting elements and the conductor layer 23 by devising the arrangement of light emitting elements has been described. The invention is not limited to this example, and the variations in the contact area between the bumps 37, 38 and the conductor layer 23 may be reduced by adjusting the heights of the bumps 37, 38.

Figure 23:
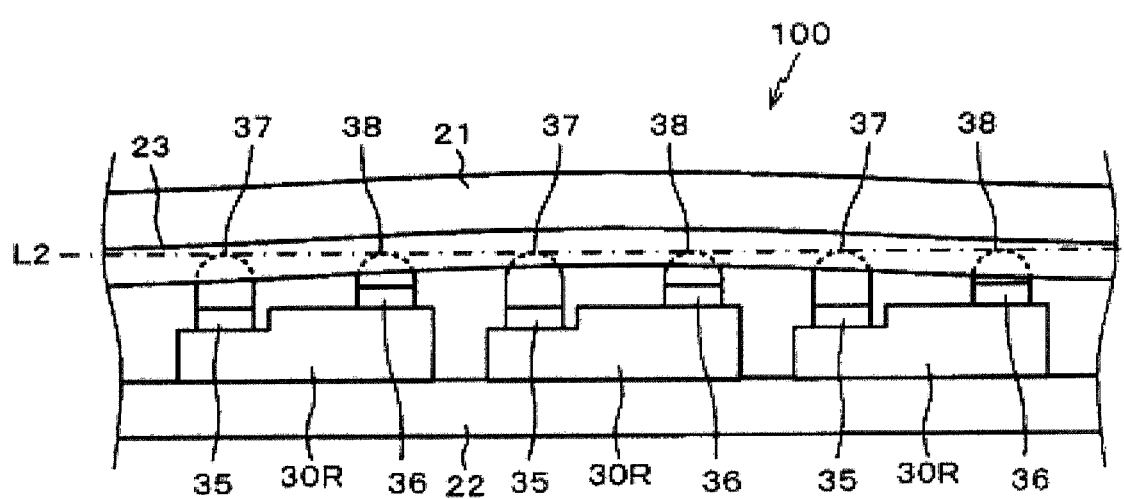
FIG. 23 is a diagram illustrating a light emitting module according to a second embodiment.

As illustrated in FIG. 23, the light emitting module 10 according to a second embodiment includes only a plurality of light emitting elements 30R, for example. The heights of the bumps 37, 38 formed in the electrode pads 35, 36 of the light emitting elements 30R are adjusted so that the vertexes of the bumps 37, 38 substantially coincide with a straight line L2. Therefore, when the light emitting elements 30R are clamped on the conductor layer 23, the bumps 37, 38 of the light emitting elements 30R bite into the conductor layer 23 with substantially the same degree. Therefore, even when the arrangement heights of the electrode pads 35, 36 of the respective light emitting elements 30R are different, the conductor layer 23 and the electrode pads 35, 36 of the respective light emitting elements 30R can be connected via the bumps 37, 38 with no variation in connection strength.

Although the embodiments of the invention have been described above, the invention is not limited to this example. For example, in the above embodiments, a case in which the light emitting element group 100 is arranged as illustrated in FIG. 7 has been described as an example, but the arrangement of the light emitting element group 100 is not limited to this example. For example, the light emitting element group 100 may be arranged to form a character or a pattern. In the above description, the example in which the light emitting element group 100 is constituted by the light emitting elements 30R, 30G, 30B has been described, but the light emitting element group 100 may be constituted by light emitting elements of a single color.

Further, in the above description, a case in which the resin layer 24 is formed of the thermosetting resin 241 and the thermosetting resin 242 has been described. The resin layer 24 is not limited to this example, and the resin layer 24 may be formed of only thermoplastic resin. Further, in the resin layer 24, any one of the thermosetting resin 241 and the thermosetting resin 242 may be formed of thermoplastic resin. As the thermoplastic resin material, an acrylic elastomer is used, for example.

In the above description, a case in which the mesh patterns 200 to 209 are formed by cutting the conductor layer 23 using laser has been described, but a mesh pattern formation method may be etching processing.

Further, in the above description, a case in which the arrangement is performed such that a distance between first electrodes having a high height of the adjacent light emitting elements is smaller than a distance between second electrodes having a low height has been described, but the arrangement may be performed such that the distance between the second electrodes having the low height of the adjacent light emitting elements is smaller than the distance between the first electrodes having the high height. Even in the case of this arrangement, the variation in the contact area between each electrode and the conductor layer can be reduced, as compared with a case in which the first electrode of the high height of the light emitting element and the second electrode of the low height are arranged adjacent to each other.

As described above, in the light emitting modules according to the above embodiments and the modifications, the electrodes of the respective light emitting elements are connected to the conductor layer with no variation in strength. Therefore, it is possible to suppress a manufacturing variation of the light emitting module and improve the lifespan in the reliability test.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A light emitting module, comprising:
   a first insulating film having optical transparency;
   a second insulating film arranged facing the first insulating film and having optical transparency;
   a conductor layer formed on the first insulating film; and
   a plurality of light emitting elements arranged between the first insulating film and the second insulating film and connected to the conductor layer in a first surface on one side, each of the plurality of light emitting elements including a first electrode in which a height from a second surface opposite to the first surface is a first height and a second electrode in which a height from the second surface is a second height,
   wherein the plurality of light emitting elements are arranged such that a distance between the first electrodes of adjacent light emitting elements is smaller than a distance between the second electrodes.

2. The light emitting module according to claim 1, further comprising a resin layer between the first insulating film and the second insulating film.

3. The light emitting module according to claim 2, wherein the resin layer is a material having at least one of thermosetting property and thermal plasticity.

4. The light emitting module according to claim 1, wherein, in the plurality of light emitting elements, the first height is higher than the second height.

5. The light emitting module according to claim 1, wherein the plurality of light emitting elements include a first light emitting element to emit light of a first color and a second light emitting element to emit light of a second color different from the first color.

6. The light emitting module according to claim 5, wherein the plurality of light emitting elements include a first light emitting element to emit red light, a second light emitting element to emit green light, and a third light emitting element to emit blue light.

7. A light emitting module, comprising:
   a first insulating film having optical transparency;
   a second insulating film arranged facing the first insulating film and having optical transparency;
   a conductor layer formed on the first insulating film; and
   three or more light emitting elements arranged between the first insulating film and the second insulating film and connected to the conductor layer in a first surface on one side, each of the three or more light emitting elements including a first electrode in which a height from a second surface opposite to the first surface is a first height and a second electrode in which a height from the second surface is a second height;
a first bump formed in the first electrode; and
a second bump formed in the second electrode,
wherein, in the three or more light emitting elements, the first height is higher than the second height, and the respective first electrodes are linearly arranged, and
wherein the respective bumps bite into the conductor layer at the same depth.

8. The light emitting module according to claim 1, wherein, in the plurality of light emitting elements, the respective first electrodes are arranged on the same circumference.

9. The light emitting module according to claim 8, wherein the plurality of light emitting elements include four light emitting elements and are arranged to be horizontally symmetrical with respect to a center of the circumference.

10. The light emitting module according to claim 9, wherein the four light emitting elements include two first light emitting elements to emit red light, one second light emitting element to emit green light, and one third light emitting element to emit blue light.

11. The light emitting module according to claim 10, wherein one first light emitting element out of the two first light emitting elements to emit red light is not electrically connected.

12. A light emitting module, comprising:
a first insulating film having optical transparency;
a second insulating film arranged facing the first insulating film and having optical transparency;
a conductor layer formed on the first insulating film;
a plurality of light emitting elements arranged between the first insulating film and the second insulating film and connected to the conductor layer in a first surface on one side, each of the plurality of light emitting elements including a first electrode in which a height from a second surface opposite to the first surface is a first height and a second electrode in which a height from the second surface is a second height;
a first bump formed in the first electrode; and
a second bump formed in the second electrode,
wherein a height of the first bump from the second surface is equal to a height of the second bump from the second surface, and
wherein the first and second bumps bite into the conductor layer with substantially the same degree.

13. The light emitting module according to claim 1, wherein a difference in contact area between each of the first electrode and the second electrode of the plurality of light emitting elements and the conductor layer is 1500 $\mu m^2$ or less.

14. The light emitting module according to claim 7, wherein a difference in contact area between each of the first electrode and the second electrode of the three or more light emitting elements and the conductor layer is 1500 $\mu m^2$ or less.

15. The light emitting module according to claim 12, wherein a difference in contact area between each of the first electrode and the second electrode of the plurality of light emitting elements and the conductor layer is 1500 $\mu m^2$ or less.

16. A manufacturing method of a light emitting module, comprising:
arranging a resin film overlapping a conductor layer in a first insulating film having optical transparency, the conductor layer being formed on one side of the first insulating film;
arranging a plurality of light emitting elements connected to the conductor layer in a first surface on one side on the resin film and including a first electrode in which a height from a second surface opposite to the first surface is a first height and a second electrode in which a height from the second surface is a second height such that a distance between the first electrodes of adjacent light emitting elements is smaller than a distance between the second electrodes;
arranging a second insulating film having optical transparency to face the first insulating film with the plurality of light emitting elements interposed between the first insulating film and the second insulating film; and
clamping the first insulating film and the second insulating film.

17. The manufacturing method of the light emitting module according to claim 16, wherein, in a case in which the first height is higher than the second height, when arranging the light emitting elements, the first electrodes of three or more light emitting elements are linearly arranged.

18. The manufacturing method of the light emitting module according to claim 16, wherein, in a case in which the first height is higher than the second height, when arranging the light emitting elements, the first electrodes of the plurality of light emitting elements are arranged on the same circumference.

19. The manufacturing method of the light emitting module according to claim 18, further comprising:
arranging at least one light emitting element being not electrically connected when arranging the light emitting elements.

* * * * *